United States Patent [19]
Yano

[11] Patent Number: 5,798,720
[45] Date of Patent: Aug. 25, 1998

[54] PARALLEL TO SERIAL DATA CONVERTER

[75] Inventor: Motoyasu Yano, Kanagawa, Japan

[73] Assignee: Sony Corporation, Japan

[21] Appl. No.: 848,632

[22] Filed: Apr. 29, 1997

[30]     Foreign Application Priority Data

May 14, 1996 [JP] Japan ..................... 8-119166

[51] Int. Cl.$^6$ ......................................... H03M 9/00
[52] U.S. Cl. ........................ 341/101; 375/360; 341/100
[58] Field of Search ................................ 341/100, 101; 375/360, 361; 327/401.24; 326/93

[56]             References Cited

U.S. PATENT DOCUMENTS

| | | | |
|---|---|---|---|
| 4,752,942 | 6/1988 | Iwakami | 375/110 |
| 5,012,240 | 4/1991 | Takahashi et al. | 341/101 |
| 5,548,285 | 8/1996 | Ford et al. | 341/100 |
| 5,548,622 | 8/1996 | Ma | 375/354 |
| 5,563,594 | 10/1996 | Ford et al. | 341/100 |
| 5,627,828 | 5/1997 | Lee | 370/445 |
| 5,714,904 | 2/1998 | Jeong | 327/407 |

Primary Examiner—Brian K. Young
Assistant Examiner—Peguy JeanPierre
Attorney, Agent, or Firm—Ronald P. Kananen

[57]             ABSTRACT

The invention provides a parallel to serial data converter wherein the frequency of a basic clock pulse signal to be applied for driving can be reduced to one half with respect to a same data rate and consequently the operation speed required for a circuit in a preceding stage can be reduced, and a bad influence of noise such as, for example, jitters of serial data is eliminated. In the parallel to serial data converter, a clock pulse signal having a frequency f/2 Hz equal to one half the data rate of parallel data which is f bps is used as a basic clock pulse signal, and an inverted pulse signal is produced from the basic clock pulse signal. Then, a rising or falling edge of each pulse of the basic clock pulse signal and a rising or falling edge of each pulse of the inverted pulse signal are detected, and a byte clock pulse signal having a frequency equal to that of the parallel data is produced by logical ORing of such two edge detection outputs and is supplied to a multiplexer.

10 Claims, 5 Drawing Sheets

PARALLEL TO SERIAL DATA CONVERTER

BACKGROUND OF THE INVENTION

This invention relates to a parallel to serial data converter, and more particularly to a parallel to serial data converter wherein the data rate of parallel data can be raised to twice with respect to a same driving frequency or, in other words, the driving frequency can be reduced to one half with respect to a same data rate.

FIG. 1 is a circuit block diagram showing a parallel to serial data converter of a related art. Referring to FIG. 1, the parallel to serial data converter shown has a parallel data input terminal 1. While the parallel data input terminal 1 is provided for n (n is a positive integer) bits, only one input terminal is shown in FIG. 1 for convenience of illustration. The data rate of the parallel data is f bps. The parallel to serial data converter further has a byte clock pulse input terminal 2 for receiving a byte clock pulse signal whose frequency is f and includes an input circuit 3 formed from n flip-flop circuits F/F and driven with the byte clock pulse signal for receiving and latching the parallel data.

The parallel to serial data converter further includes a multiplexer 4 for outputting the parallel data from the input circuit 3 successively and serially one after another one bit. The data rate of the serial output is n·f bps. The parallel to serial data converter further includes a phase-locked loop (PLL) synthesizer 5 for generating a bit clock pulse signal for driving the multiplexer 4. The PLL synthesizer 5 receives the byte clock pulse signal and generates a bit clock pulse signal having a frequency equal to n times the frequency of the byte clock pulse signal, that is, n·f Hz. The parallel to serial data converter further has an output terminal 6 for outputting the serial data from the multiplexer 4. The frequency n·f of the bit clock pulse signal is, for example, 1.25 GHz.

In operation, when n-bit parallel data are inputted via the parallel data input terminal 1 and a byte clock pulse signal is inputted to the byte clock input terminal 2, the parallel data are detected by the input circuit 3 formed from n flip-flops F/F and then inputted to the multiplexer 4. Meanwhile, the PLL synthesizer 5 generates, upon reception of the byte clock pulse signal from the byte clock input terminal 2, a bit clock pulse signal having a frequency n·f equal to n times the frequency of the byte clock pulse signal in synchronism with the byte clock pulse signal and drives the multiplexer 4 with the bit clock pulse signal. Consequently, n-bit parallel data are outputted serially one after another one bit from the multiplexer 4. The data rate then is n·f bps.

The parallel to serial data converter shown in FIG. 1 receives a byte clock pulse signal having a frequency of f Hz as a driving pulse signal, produces, by means of the multiplexer 4 thereof, a bit clock pulse signal having a frequency n·f equal to n times the frequency of the byte clock pulse signal, converts parallel data inputted at the data rate of f bps into serial data at the data rate of n·f bps and outputs the serial data.

By the way, since it is usually required that a parallel to serial data converter operate at a very high rate, it is difficult to use, for a signal processing IC in the preceding stage, a CMOS IC which is used popularly for a signal processing IC, and such a case wherein a bipolar IC or a GaAs semiconductor IC which can operate at a very high rate must be used is progressively increasing.

Since parallel data are usually a non-return to zero (NRZ) signal, the highest operation frequency may be equal to one half frequency f/2 Hz that of the data rate. However, since also a byte clock pulse signal having the frequency f Hz synchronized with the data must be outputted, the operation frequency of the output of the signal processing IC in the preceding stage to the parallel to serial data converter must be equal to the frequency of the data rate after all.

In other words, the data rate of the parallel data relies upon the frequency of the byte clock pulse signal. Further, if a byte clock pulse signal of a high frequency is transmitted, then this makes a noise source. As a result, the parallel to serial data converter is disadvantageous also in that the characteristic of the PLL synthesizer 5 is degraded by the noise and the serial data produced suffer from jitters.

SUMMARY OF THE INVENTION

It is an object of the present invention to provide a parallel to serial data converter which is driven with a comparatively low driving clock pulse signal.

It is another object of the present invention to provide a parallel to serial data converter which eliminates jitters.

In order to attain the objects described above, according to the present invention, there is provided a parallel to serial data converter, comprising an input circuit for latching n-bit parallel data in response to a first control pulse signal, n being a positive integer, a multiplexer for outputting the n-bit parallel data inputted to the input circuit serially one after another one bit in response to a second control pulse signal, a first edge detection circuit for receiving an input clock pulse signal and detecting an edge of each pulse of the input clock pulse signal, a second edge detection circuit for receiving an inverted pulse signal of the input clock pulse signal and detecting an edge of each pulse of the inverted pulse signal, a logic circuit for generating a pulse signal in response to each of detection output pulse signals of the first and second edge detection circuits and outputting the pulse signal as the first control pulse signal to the input circuit, and a pulse generation circuit for receiving the pulse signal of the logic circuit to produce a pulse signal and outputting the pulse signal as the second control pulse signal to the multiplexer.

In the parallel to serial data converter, an edge such as a rising edge or a falling edge of each pulse of an input clock pulse signal and an edge such as a rising edge or a falling edge of each pulse of an inverted pulse signal of the input clock pulse signal are detected, and the logic circuit generates a pulse signal in response to each of the thus detected edges. Then, the pulse signal of the logic circuit is outputted as the first control signal to the input circuit in order to latch input n-bit parallel data and is used for the pulse generation circuit to produce a pulse signal to be outputted as the second control signal to the multiplexer to convert the n-bit parallel data into serial data.

With the parallel to serial data converter, since an edge of each pulse of the input clock pulse signal and an edge of each pulse of the inverted pulse signal of the input clock pulse signal are detected and a pulse signal is generated by the logic circuit each time an edge is detected, the pulse signal generated is synchronized with the input clock pulse signal but has a frequency twice that of the input clock pulse signal. Consequently, the pulse signal from the logic circuit can be used as a byte clock signal, that is, the first control signal, to control the input circuit. Further, the pulse signal of the logic circuit can be inputted to the pulse generation circuit as a pulse signal based on which a bit clock pulse signal, that is, the second control signal, is to be produced.

Accordingly, the input clock pulse signal to be inputted to the parallel to serial data converter may have a frequency equal to one half the data rate of the parallel data, and the operation speed of a signal processing circuit in the preceding stage to the parallel to serial data converter may be reduced to one half comparing with a conventional operation speed. Accordingly, even where conventionally it cannot be avoided to use, for example, a bipolar IC or a GaAs semiconductor IC as a signal processing IC in the preceding stage to the parallel to serial data converter, by applying the present invention, such a case wherein there is no problem even if a CMOS IC is used increases.

Further, since the normal phase and the inverted phase of the same input clock pulse signal are used, noises which are produced when pulses of both of the normal and inverted phases vary cancel each other. As a result, the clock noise is advantageously reduced to a very low level.

Further, although a skew may possibly be produced between the normal phase pulse signal and the opposite phase pulse signal, this does not make a problem if the frequency band of the pulse generation circuit is set to a band which does not respond to the modulation frequency f/2 (f is a data rate of the input parallel data). The reason is that, if the frequency band of the pulse generation circuit is set in this manner, then the pulse generation circuit effects phase modulation with a period of 2T (T=1/f) as seen in FIG. 5 and any phase modulation of such a high modulation frequency is removed by a loop filter or a like element which limits the frequency response band of the pulse generation circuit.

The above and other objects, features and advantages of the present invention will become apparent from the following description and the appended claims, taken in conjunction with the accompanying drawings in which like parts or elements are denoted by like reference characters.

DESCRIPTION OF THE PREFERRED EMBODIMENT

Figure 2A:
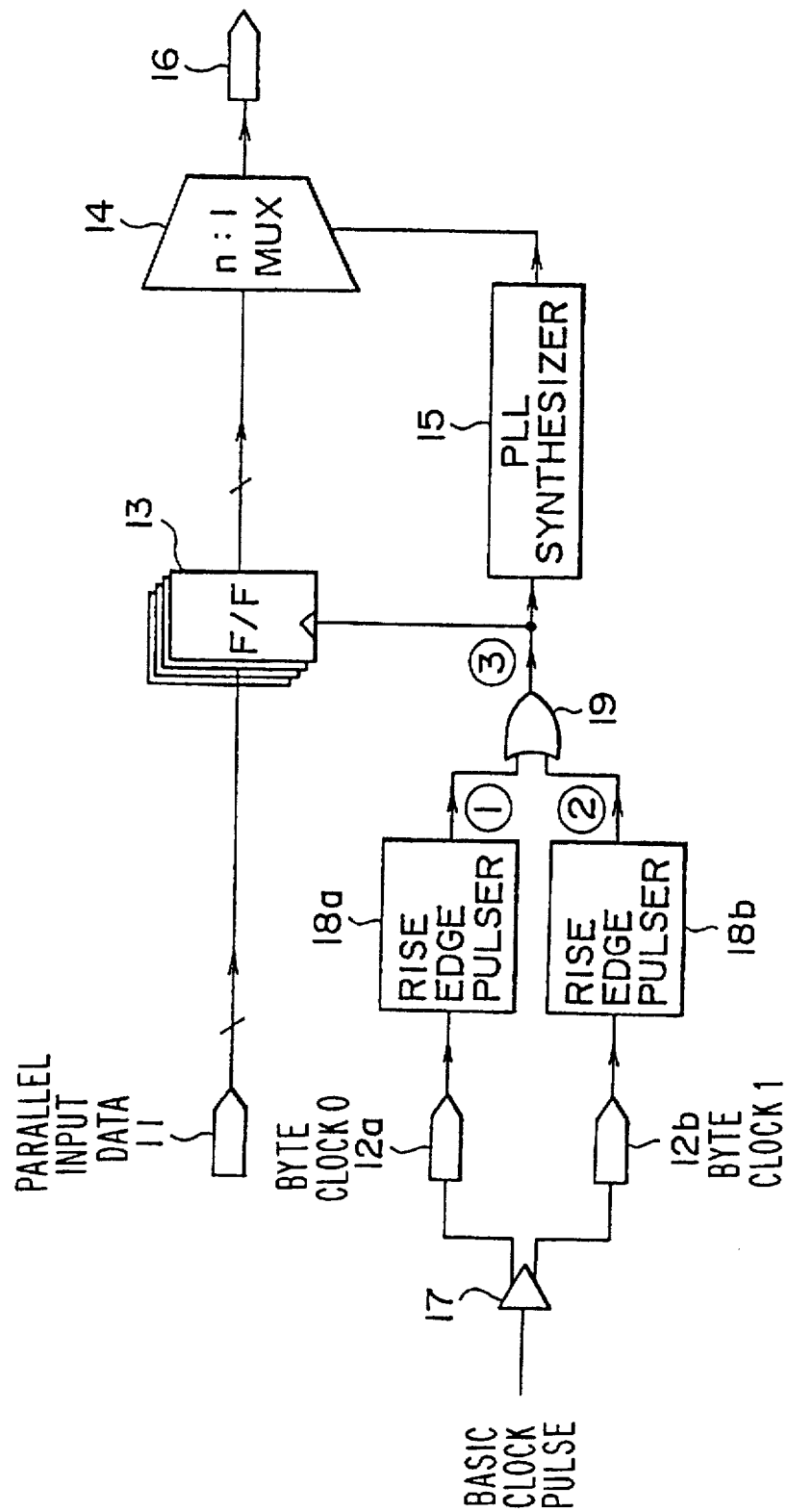
FIG. 2A is a circuit block diagram of a parallel to serial data converter showing a first preferred embodiment of the present invention.
Figure 2B:
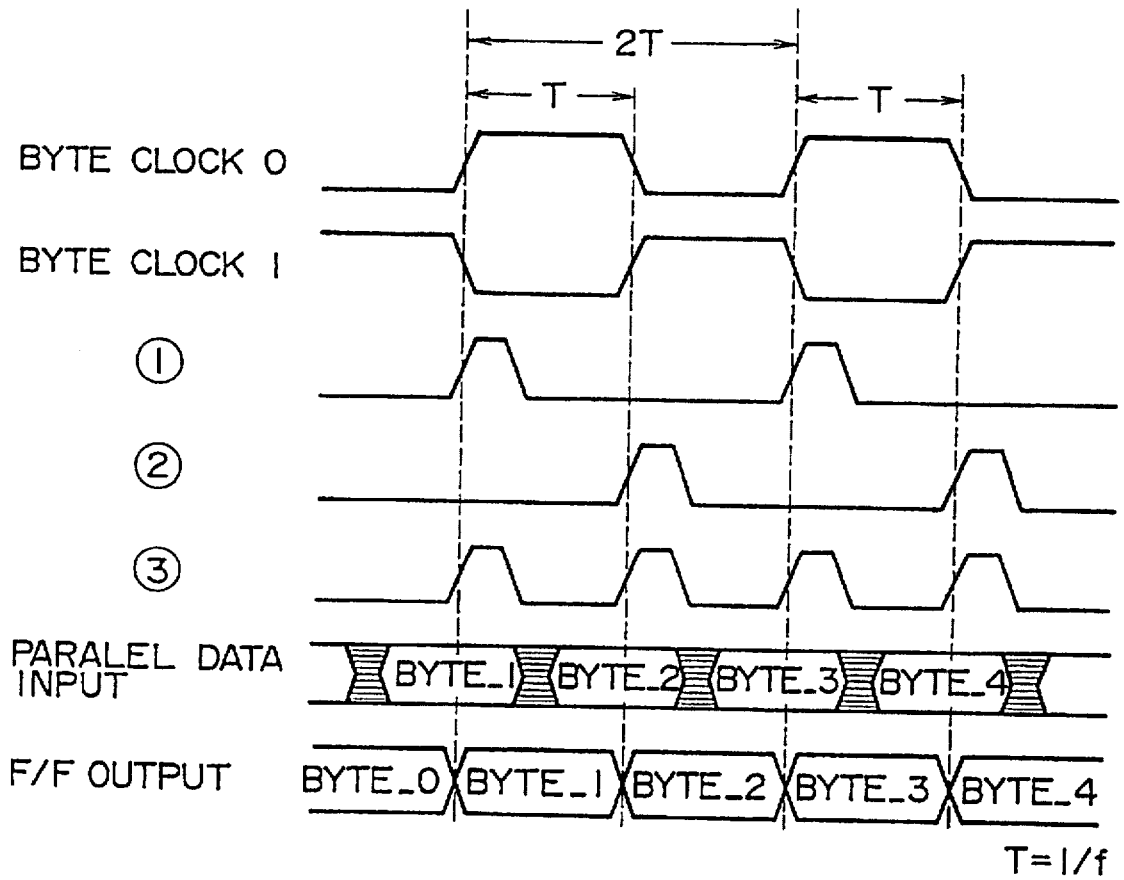
FIG. 2B is a timing chart illustrating operation of the parallel to serial data converter of FIG. 2A.

Referring first to FIG. 2A, there is shown a parallel to serial data converter to which the present invention is applied. The parallel to serial data converter shown has a parallel data input terminal 11. While the parallel data input terminal 11 is provided for n (n is a positive integer) bits, only one input terminal is shown in FIG. 2A for convenience of illustration. The data rate of the parallel data is f bps. The parallel to serial data converter includes a circuit 17 which produces, from a basic clock pulse signal having a frequency of f/2 Hz, a byte clock pulse signal Byte Clock0 having the same phase as that of the basic clock pulse signal and another byte clock pulse signal Byte Clock1 having an opposite phase inverted from that of the basic clock pulse signal. The byte clock pulse signals Byte Clock0 and Byte Clock1 are inputted to byte clock pulse input terminals 12a and 12b, respectively.

Figure 3A:
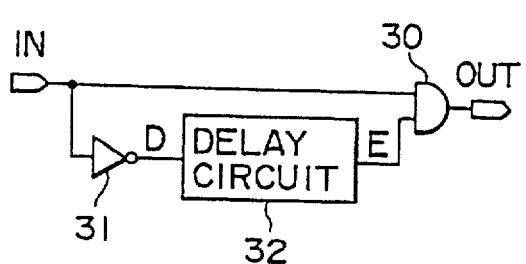
FIG. 3A is a circuit diagram showing a form of rising edge detection circuit of the parallel to serial data converter of FIG. 2A
Figure 3B:
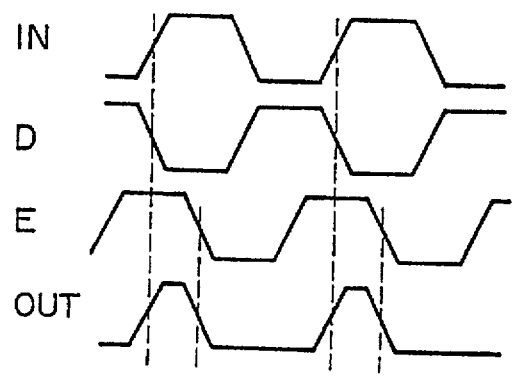
FIG. 3B is a timing chart illustrating operation of the rising edge detection circuit of FIG. 3A.
Figure 4A:
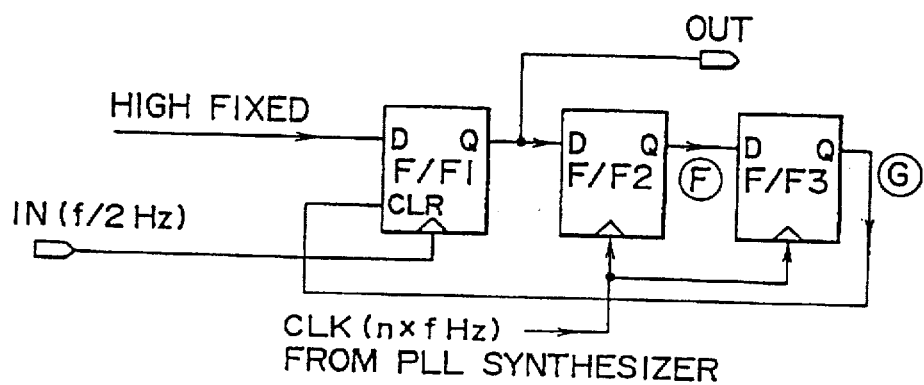
FIG. 4A is a circuit diagram showing another form of rising edge detection circuit of the parallel to serial data converter of FIG. 2A

The parallel to serial data converter further includes a pair of rising edge detection circuits 18a and 18b for detecting rising edges of the byte clock pulse signal Byte Clock0 and the byte clock pulse signal Byte Clock1, respectively. Each of the rising edge detection circuits 18a and 18b may have, for example, such a construction as shown in FIG. 3A or 4A. Referring to FIG. 3A, in the rising edge detection circuit shown, the byte clock pulse signal Byte Clock0 (or Byte Clock1) (in FIGS. 3A and 3B, denoted by reference symbol IN) is applied as it is to one of a pair of input terminals of an AND circuit 30 while another signal E obtained by inverting the byte clock pulse signal Byte Clock0 (or Byte Clock1) by means of an invertor 31 and delaying a signal D obtained by the inversion by means of a delay circuit 32 is applied to the other input terminal of the AND circuit 30. Consequently, an output OUT in which a pulse appears at each rising edge of the byte clock pulse signal Byte Clock0 (or Byte Clock1) as seen in FIG. 3B is obtained from the AND circuit 30. It is to be noted that the delay circuit 32 may be formed from, for example, a CR circuit or a cascade connection of a suitable number of stages of gates.

Figure 4B:
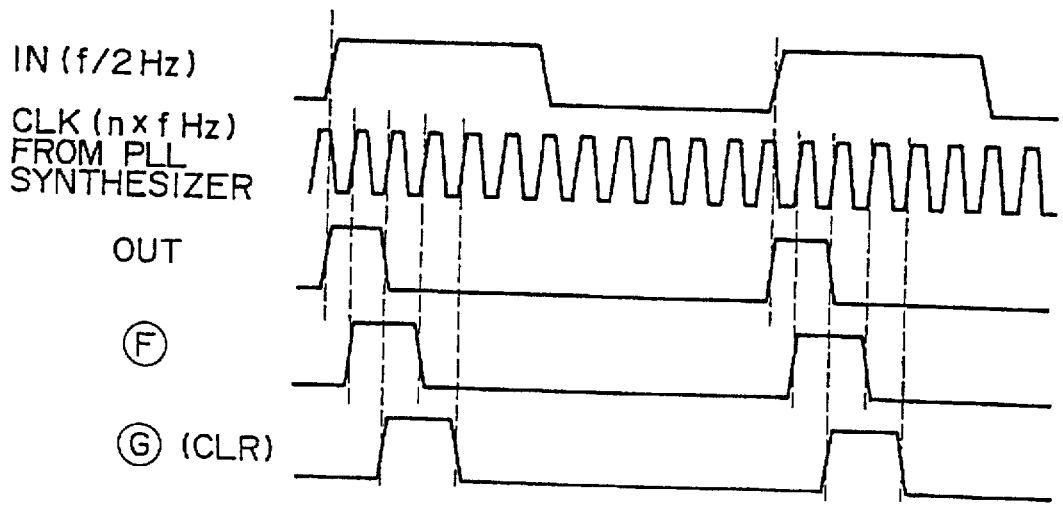
FIG. 4B is a timing chart illustrating operation of the rising edge detection circuit of FIG. 4A.
Figure 5:
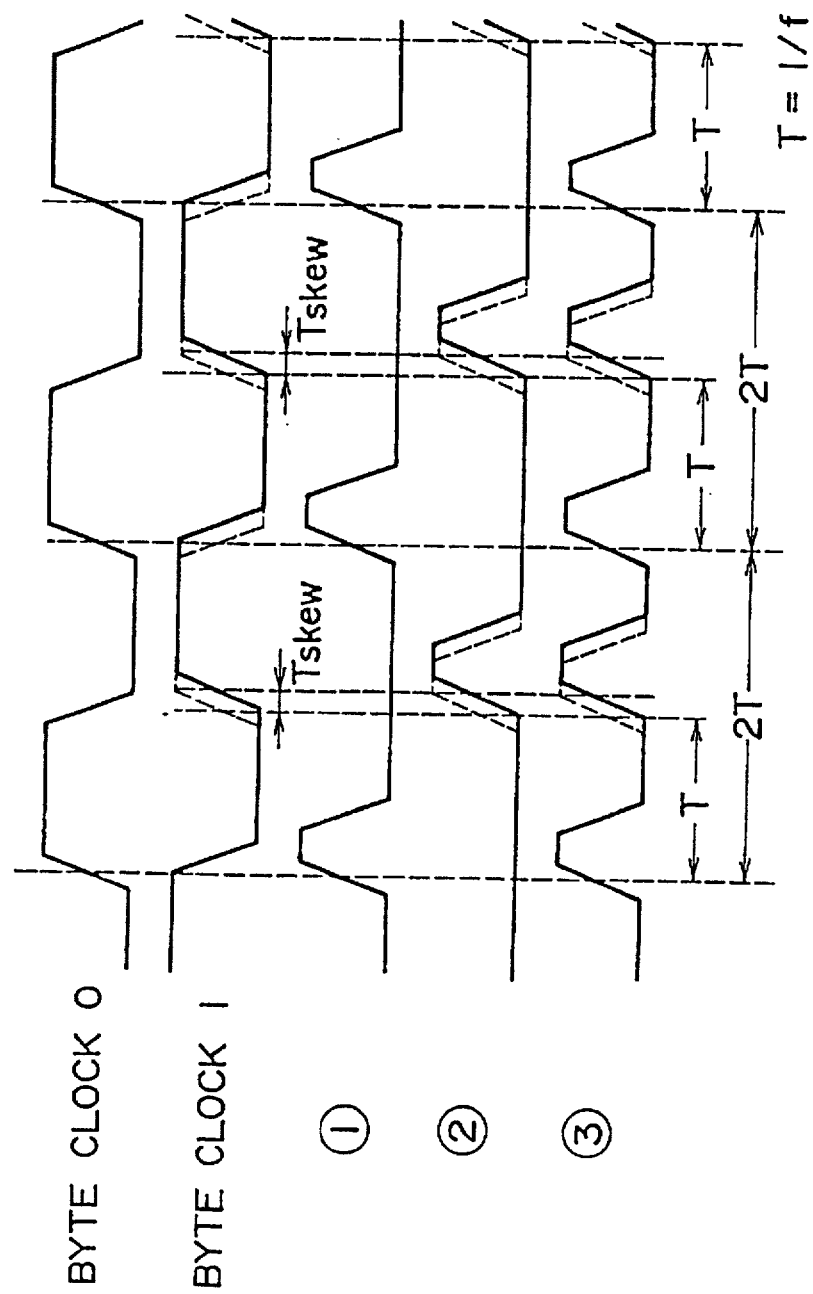
FIG. 5 is a timing chart illustrating that operation of a PLL synthesizer of the parallel to serial data converter of FIG. 2A is not influenced by any skew between byte clock pulse signals of the parallel to serial data converter.

Meanwhile, the rising edge detection circuit shown in FIG. 4A utilizes an output pulse signal of a PLL synthesizer 15, which will be hereinafter described, so that an output OUT in which a pulse appears in synchronism with each rising edge of the byte clock pulse signal Byte Clock0 (or Byte Clock1, denoted by IN in FIGS. 4A and 4B can be obtained as seen in FIG. 5 by flip-flop circuits F/F1 to F/F3 which have a clear terminal.

It is to be noted that, while rising edges of the byte clock pulse signals Byte Clock0 and Byte Clock1 are detected in the present embodiment, the object of the detection is not limited to them, and falling edges may be detected alternatively.

Referring back to FIG. 2A, the parallel to serial data converter further includes a logical OR circuit 19 which receives outputs ① and ② of the rising edge detection circuits 18a and 18b and whose output ③ serves as a byte clock pulse signal of a frequency f Hz. The parallel to serial data converter further includes an input circuit 13 formed from n flip-flop circuits F/F for receiving and latching parallel data. The input circuit 13 is driven with the byte clock pulse signal ③ whose frequency is f Hz. The parallel to serial data converter further includes a multiplexer 14 which outputs parallel data from the input circuit 13 successively and serially one after another one bit. The data rate then is n·f bps. The parallel to serial data converter further includes a PLL synthesizer 15 for generating a bit clock pulse signal for driving the multiplexer 14. The PLL synthesizer 15 receives the byte clock pulse signal ③ and generates a bit clock pulse signal having a frequency of n·f Hz equal to n times that of the byte clock pulse signal ③. The parallel to serial data converter further has an output terminal 16 for outputting serial data from the multiplexer 14.

Figure 1:
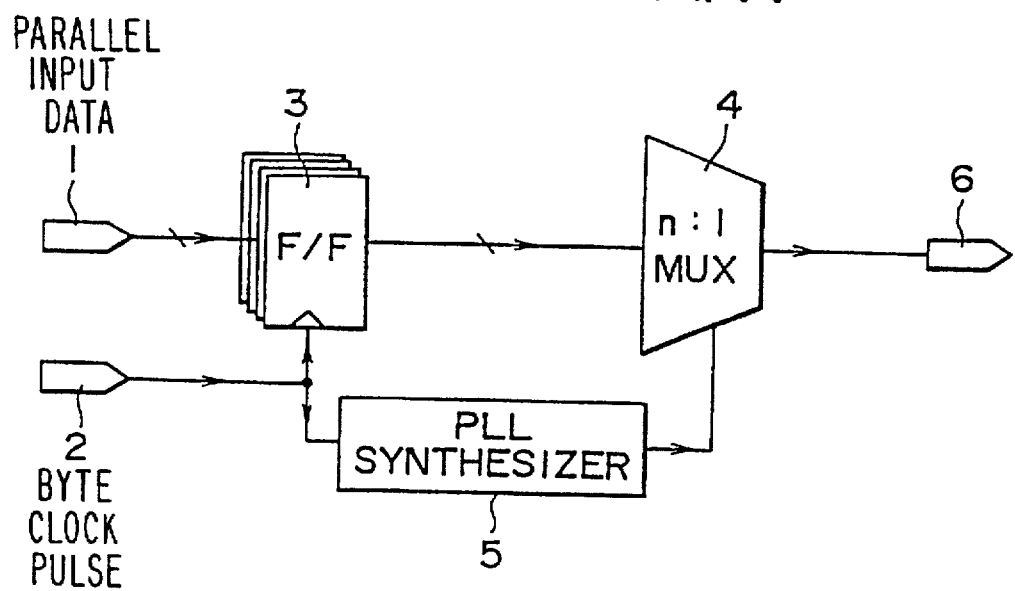
FIG. 1 is a circuit block diagram showing a parallel to serial data converter of a related art.

In operation, n-bit (for example, n=10 as a result of 8b/10b conversion by, for example, a CMOS IC in the preceding stage) are inputted via the parallel data input terminal 11. Meanwhile, a byte clock pulse signal Byte Clock0 whose frequency is f/2 is inputted via the byte clock pulse input terminal 12a while another byte clock pulse signal Byte Clock1 whose frequency is f/2 is inputted via the byte clock pulse input terminal 12b. The byte clock pulse signals Byte Clock0 and Byte Clock1 are inputted to the rising edge detection circuits 18a and 18b, respectively. Consequently, a pulse signal ① which is generated at each rising edge of the byte clock pulse signal Byte Clock0 and another pulse signal ② which is generated at each rising edge of the byte clock pulse signal Byte Clock1 are outputted from the rising edge detection circuits 18a and 18b, respectively. The pulse signals ① and ② are inputted to the logical OR circuit 19, and from the logical OR circuit 19, a byte clock pulse signal ③ is outputted. The byte clock pulse signal ③ is a pulse signal corresponding to the byte clock pulse signal of the parallel to serial data converter described hereinabove with reference to FIG. 1. The byte clock pulse signal ③ is applied as a driving pulse signal to the input circuit 13 which is formed from n flip-flops F/F.

Meanwhile, the parallel data inputted from the parallel data input terminal 11 are fetched by the input circuit 13 and then inputted to the multiplexer 14. Then, the PLL synthesizer 15 generates, when the byte clock pulse signal ③ is received, a bit clock pulse signal having a frequency n·f equal to n times that of the byte clock pulse signal ③ in synchronism with the byte clock pulse signal ③ and drives the multiplexer 14 with the bit clock pulse signal. Consequently, the n-bit parallel data are outputted serially one after another one bit from the multiplexer 14. The data rate then is n·f bps, for example, 1.25 Gbps.

In this manner, the parallel to serial data converter shown in FIG. 2A receives a clock pulse signal whose frequency is f/2 Hz as a driving pulse signal, produces byte clock pulse signals Byte Clock0 and Byte Clock1 of f Hz, further produces a byte clock pulse signal ③ of f Hz from the byte clock pulse signals Byte Clock0 and Byte Clock1, drives the input circuit 13 with the byte clock pulse signal ③ and applies the byte clock pulse signal ③ to the PLL synthesizer 15. The PLL synthesizer 15 receives the byte clock pulse signal ③ and produces, based on the byte clock pulse signal ③, a bit clock pulse signal having a frequency n·f equal to n times that of the byte clock pulse signal ③. Further, the PLL synthesizer 15 converts the parallel data inputted thereto at the data rate of f bps into serial data at the data rate of n·f bps and outputs the serial data.

Accordingly, the driving basic clock pulse signal to be inputted to the parallel to serial data converter may have a frequency equal to one half the data rate of the parallel data, and the operation speed of a signal processing circuit in the preceding stage to the parallel to serial data converter may be reduced to one half comparing with a conventional operation speed. Accordingly, even where conventionally it cannot be avoided to use, for example, a bipolar IC or a GaAs semiconductor IC as a signal processing IC in the preceding stage to the parallel to serial data converter, application of the present invention increases a case wherein there is no problem even if a CMOS IC is used.

Incidentally, it may be considered that an interleaving technique may possibly be used such that, using two inputting elements which operate with a driving frequency of f/2 bps, parallel data are inputted to the two byte clock pulse input terminals 12 and one of the byte clock pulse input terminals 12 is driven with the byte clock pulse signal Byte Clock0 while the other byte clock pulse input terminal 12 is driven with the byte clock pulse signal Byte Clock1 so that the parallel data are shifted by the multiplexer 14 to convert them into serial data. This reduces the frequency of the basic pulse signal to be inputted to the parallel to serial data converter to f/2, similarly to the parallel to serial data converter of the present embodiment. However, such employment of the interleaving technique in the parallel to serial data converter increases the bit width of data to twice and is not the best plan since the number of elements is increased such that the number of flip-flops must be increased to twice and this gives rise to an increase in power dissipation.

Further, with the parallel to serial data converter of the present embodiment, since the normal phase and the inverted phase of the same basic clock pulse signal are used, noises which are produced when pulses of both of the normal and inverted phases vary (rise or fall) cancel each other. As a result, the clock noise is advantageously reduced to a very low level.

Further, although a skew may possibly be produced between the normal phase byte clock pulse signal Byte Clock0 and the opposite phase byte clock pulse signal Byte Clock1, this does not make a problem if the frequency band of the PLL synthesizer is set to a band which does not respond to the modulation frequency f/2. FIG. 5 is a timing chart illustrating this.

In particular, although a skew Tskew may possibly be produced between the byte clock pulse signal Byte Clock0 and the byte clock pulse signal Byte Clock1, such skew Tskew is produced once per one period 2T. Accordingly, if the frequency band of the PLL synthesizer 15 is set to a band which does not respond to the modulation frequency f/2, then any phase modulation of such a high modulation frequency is removed by a loop filter or a like element which limits the frequency response band of the PLL synthesizer so that the PLL synthesizer 15 may not be influenced by the skew at all.

With the parallel to serial data converter of the present invention, since a rising edge (or a falling edge) of each pulse of the basic clock pulse signal and a rising edge (or a falling edge) of each pulse of an inverted pulse signal of the basic clock pulse signal are detected and a pulse signal can be generated each time an edge is detected, the pulse signal obtained is synchronized with the basic clock pulse signal but has a frequency twice that of the basic clock pulse signal. Consequently, the pulse signal can be used as a byte clock signal to control the input circuit and besides can be inputted as a pulse signal, based on which a bit clock pulse signal is to be produced, to the pulse generation circuit.

Accordingly, the driving basic clock pulse signal to be inputted to the parallel to serial data converter may have a frequency equal to one half the data rate of the parallel data, and the operation speed of a signal processing circuit in the preceding stage to the parallel to serial data converter may be reduced to one half comparing with a conventional operation speed. Accordingly, even where conventionally it cannot be avoided to use, for example, a bipolar IC or a GaAs semiconductor IC as a signal processing IC in the preceding stage to the parallel to serial data converter, if the present invention is applied, then such a case wherein there is no problem even if a CMOS IC is used increases.

Further, since the normal phase and the inverted phase of the same basic clock pulse signal are used, noises which are produced when pulses of both of the normal and inverted phases vary cancel each other. As a result, the clock noise is advantageously reduced to a very low level.

Further, although a skew may possibly be produced between the normal phase pulse signal and the opposite phase pulse signal, this does not make a problem if the frequency band of the PLL synthesizer is set to a band which does not respond to the modulation frequency f/2. The reason is that, if the frequency band of the PLL synthesizer is set in this manner, then the PLL circuit effects phase modulation with a period of 2T (T=1/f) as seen in FIG. 5 and any phase modulation of such a high modulation frequency is removed by a loop filter or a like element which limits the frequency response band of the PLL synthesizer thereby to eliminate the screw.

What is claimed is:

1. A parallel to serial data converter, comprising:

an input circuit for latching n-bit parallel data in response to a first control pulse signal, n being a positive integer;

a multiplexer for outputting the n-bit parallel data inputted to said input circuit serially one after another one bit in response to a second control pulse signal;

a first edge detection circuit for receiving an input clock pulse signal and detecting an edge of each pulse of the input clock pulse signal;

a second edge detection circuit for receiving an inverted pulse signal of the input clock pulse signal and detecting an edge of each pulse of the inverted pulse signal;

a logic circuit for generating a pulse signal in response to each of detection output pulse signals of said first and second edge detection circuits and outputting the pulse signal as the first control pulse signal to said input circuit; and a pulse generation circuit for receiving the pulse signal of said logic circuit to produce a pulse signal and outputting the pulse signal as the second control pulse signal to said multiplexer.

2. A parallel to serial data converter according to claim 1, wherein the input clock pulse signal has a data rate set lower than that of the parallel data.

3. A parallel to serial data converter according to claim 2, wherein the input clock pulse signal has a data rate set to one half that of the parallel data.

4. A parallel to serial data converter according to claim 2, wherein said clock pulse generation circuit is formed from a phase-locked loop synthesizer whose frequency band is set to a low band which does not respond to the frequency of the byte clock pulse signal outputted from said logic circuit.

5. A parallel to serial data converter according to claim 1, wherein said first and second edge detection circuits detect a rising or falling edge of each pulse of the input clock pulse signal.

6. A parallel to serial data converter according to claim 1, wherein said logic circuit which generates the output pulse signal is a logical OR circuit.

7. A parallel to serial data converter, comprising:

an input circuit for latching n-bit parallel data in response to a first control pulse signal, n being a positive integer;

a multiplexer for outputting the n-bit parallel data inputted to said input circuit serially one after another one bit in response to a second control pulse signal;

a first edge detection circuit for receiving an input clock pulse signal and detecting a rising edge or a falling edge of each pulse of the input clock pulse signal;

a second edge detection circuit for receiving an inverted pulse signal of the input clock pulse signal and detecting that one of a rising edge and a falling edge of each pulse of the inverted pulse signal which is detected by said first edge detection circuit;

a logical OR circuit for detection outputs of said first and second edge detection circuits to produce a pulse signal and outputting the pulse signal as the first control pulse signal to said input circuit; and a pulse generation circuit for receiving the pulse signal of said logic circuit to produce a pulse signal and outputting the pulse signal as the second control pulse signal to said multiplexer.

8. A parallel to serial data converter according to claim 7, wherein the input clock pulse signal has a data rate set lower than that of the parallel data.

9. A parallel to serial data converter according to claim 7, wherein the input clock pulse signal has a data rate set to one half that of the parallel data.

10. A parallel to serial data converter according to claim 7, wherein said clock pulse generation circuit is formed from a phase-locked loop synthesizer whose frequency band is set to a low band which does not respond to the frequency of the byte clock pulse signal outputted from said logic circuit.

* * * * *